(12) United States Patent
Faruque et al.

(10) Patent No.: US 7,467,074 B2
(45) Date of Patent: Dec. 16, 2008

(54) SYSTEM AND METHOD OF INTERACTIVELY ASSEMBLING A MODEL

(75) Inventors: M. Omar Faruque, Ann Arbor, MI (US); Robert Allen Kelly, Plymouth, MI (US); Shrinivas Govind, Canton, MI (US); Thiag Subbian, Farmington Hills, MI (US)

(73) Assignee: Ford Motor Company, Dearborn, MI (US)

( * ) Notice: Subject to any disclaimer, the term of this patent is extended or adjusted under 35 U.S.C. 154(b) by 863 days.

(21) Appl. No.: 10/248,639

(22) Filed: Feb. 3, 2003

(65) Prior Publication Data

US 2003/0149500 A1   Aug. 7, 2003

Related U.S. Application Data

(60) Provisional application No. 60/353,370, filed on Feb. 1, 2002.

(51) Int. Cl.
*G06G 7/48* (2006.01)

(52) U.S. Cl. .............. 703/8; 703/1; 703/6; 703/7; 715/700

(58) Field of Classification Search ............ 703/1, 703/6, 7, 8; 706/47; 700/98; 715/700
See application file for complete search history.

(56) References Cited

U.S. PATENT DOCUMENTS

| | | | |
|---|---|---|---|
| 4,821,214 A | 4/1989 | Sederberg | 345/420 |
| 5,119,309 A | 6/1992 | Cavendish et al. | 700/182 |
| 5,179,644 A | 1/1993 | Chiyokura et al. | 345/441 |
| 5,253,331 A | 10/1993 | Lorenzen et al. | 706/45 |
| 5,504,845 A | 4/1996 | Vecchione | 345/419 |
| 5,903,458 A | 5/1999 | Stewart et al. | 709/98 |
| 6,195,625 B1* | 2/2001 | Day et al. | 703/7 |

(Continued)

OTHER PUBLICATIONS

Robert E. Phillips, "Dynamic Objects for Engineering Automation", May 1997, Communications of the ACM, vol. 40 No. 5, pp. 59-65.*

(Continued)

*Primary Examiner*—Paul L Rodriguez
*Assistant Examiner*—Jason Proctor
(74) *Attorney, Agent, or Firm*—Raymond L. Coppiellie

(57) ABSTRACT

A system and method for assembling a mesh model for engineering analysis by a user is provided. The system includes a user computer system, a remotely located computer system and a data storage means. The method includes the steps of selecting a plurality of component parts having a best practice mesh model format and selecting a predetermined property for each of the selected component parts, wherein the predetermined property is selected from a best practice library stored on the data storage means. The method also includes the steps of determining if the mesh model for each of the selected component parts meets a predetermined mesh quality condition using a best practice mesh quality checking software program. The method further includes the steps of selecting a best practice connecting means for connecting the selected component parts, wherein the connecting means is selected from a best practice library of mesh models of connecting means stored in the data storage device, and assembling the selected component parts together using the connecting means and the best practice properties into a new mesh model using a best practice mesh assembly software program, and the assembled mesh model is available for further analysis.

16 Claims, 6 Drawing Sheets

U.S. PATENT DOCUMENTS

| | | | | |
|---|---|---|---|---|
| 6,389,407 | B1 * | 5/2002 | Paradis et al. | 706/47 |
| 6,510,357 | B1 * | 1/2003 | Naik et al. | 700/98 |
| 6,789,051 | B1 * | 9/2004 | Chen et al. | 703/2 |
| 6,792,397 | B2 * | 9/2004 | Yoshikawa et al. | 703/2 |

OTHER PUBLICATIONS

Craig B. Chapman and Martyn Pinfold, "The application of a knowledge based engineering approach to the rapid design and analysis of an automotive structure", 2001, Elsevier Science Ltd., pp. 1-10.*

Martyn Pinfold and Craig Chapman, "The Application of Knowledge Based Engineering Techniques to the Finite Element Mesh Generation of an Automotive Body-in-white Structure", 1999, Journal of Engineering Design, vol. 10 No. 4, pp. 1-12.*

Alan L. Clark, "A Solid Modeling Services Architecture for KBE Applications", 2001, ACM, pp. 314-315.*

Chapman and Pinfold, "Design engineering—a need to rethink the solution using knowledge based engineering," 1999, Elsevier Science B.V., pp. 257-267.*

Myer Kutz, ed.; "Mechanical Engineers' Handbook"; John Wiley & Sons, Inc.; Second Edition; pp. 935-942.*

J. Fang et al., "Weld Modeling with MSC.Nastran", 2000, MSC. Software, pp. 1-14.*

Daniel Heiserer et al., "High Performance, Process Oriented, Weld Spot Approach", Jul. 18, 2002, retrieved on Apr. 15, 2008 from http://heiserer.net.*

A. Jonscher et al., "MSC.Nastran's New Spot Weld Element in the CAE-Process", 1999, MSC.Software, pp. 1-5.*

Jaroslav Mackerle, "Finite element analysis and simulation of welding—an addendum: a bibliography (1996-2001)", 2002, IOP Publishing Ltd., pp. 295-318.*

* cited by examiner

| File | Edit | Views | Tools | | Help | | | |
|------|------|-------|-------|--|------|--|--|--|

Set Material Properties

☐ Display All Parts ☐ Select Single Part

| Part Name | Property Type | PID | # E/N | Material Name | MID | Material Type | Thick |
|-----------|---------------|-----|-------|---------------|-----|---------------|-------|
| ecken1 | Prop 01: Shell | 320 | 60/88 | 70000014 | 320 | MAT 02: Elasto | 2 |
| 5140 | Prop 01: Shell | 125 | 824/868 | 5140_340 | 125 | MAT 02: Elasto | 1.66 |
| 5141 | Prop 01: Shell | 126 | 813/854 | 5141_340 | 126 | MAT 02: Elasto | 1.66 |
| 5152 | Prop 01: Shell | 131 | 1274/1334 | 5152_340 | 131 | MAT 02: Elasto | 1.66 |
| 5153 | Prop 01: Shell | 132 | 1287/1339 | 5153_340 | 132 | MAT 02: Elasto | 1.66 |
| platten 1 | Prop 01: Shell | 321 | 172/218 | 90000014 | 321 | MAT 02: Elasto | 3 |
| CVH811 | Prop 01: Shell | 80 | 58/57 | 811_014 | 80 | MAT 02: Elasto | 5 |
| CVH901 | Prop 01: Shell | 84 | 94/115 | 901_014 | 84 | MAT 02: Elasto | 10 |
| CVH902 | Prop 01: Shell | 85 | 43/64 | 901_014 | 85 | MAT 02: Elasto | 10 |
| CVH903 | Prop 01: Shell | 86 | 62/71 | 901_014 | 86 | MAT 02: Elasto | 1.5 |
| CVH904 | Prop 01: Shell | 87 | 137/143 | 901_014 | 87 | MAT 02: Elasto | 2 |
| CVH905 | Prop 01: Shell | 88 | 172/172 | 901_014 | 88 | MAT 02: Elasto | 5 |
| CVH906 | Prop 01: Shell | 89 | 95/100 | 901_014 | 89 | MAT 02: Elasto | 10 |
| CVH907 | Prop 01: Shell | 90 | 36/46 | 901_014 | 90 | MAT 02: Elasto | 10 |
| CVH908 | Prop 01: Shell | 91 | 46/46 | 901_014 | 91 | MAT 02: Elasto | 10 |

[ Ok ] [ Save Changes ] [ Standard Materials ] [ Exit ]

— 422

Select Standard Materials

| MAT 01: Elastic |
|---|
| Seat Belt Fabric |
| MAT 02: ElastoPlastic |
| Interior Trim _ Polypropylene |
| Mild Steel _ SAE 1010 |
| High Strength Steel _ SAE 950 |
| Ultra High Strength Steel _ UHSS |
| Aluminum_AA5754 |
| Aluminum_AA6111_T4 |
| Aluminum_AA6061 |
| Aluminum_AA6063 |

420

424

[ Ok ] [ Exit ]

Overall mesh quality is GREEN

432 — Global Check Full Vehicle

| Part | Number Of Elements | Element Too Small | Warpage | Interior Angle Quads | Interior Angle Trias |
|---|---|---|---|---|---|
| Full_model | 9164 | | | R | R |

Main Groups

| Part | Number Of Elements | Element Too Small | Element Too Big | Warpage | Aspect Ratio | Interior Angle Quads | Interior Angle Trias | Tria Ratio |
|---|---|---|---|---|---|---|---|---|
| Cab_zone1 | 9164 | | Y | | | | R | |
| Cab_zone2 | 7741 | | R | | | | | |
| Bumper | 1997 | | R | | | | | |
| Front_door | 1997 | | R | | | R | R | Y |
| Engine_tran | 799 | | R | | R | | | R |
| Radiator | 448 | | | | | | E | |
| Suspension | 5969 | | Y | | | | | Y |
| Tire_wheel | 2434 | | R | | | | | |
| Framerail_fronthorn | 8380 | | | | | | | |
| Framerail_fronthorn_to_bpillar | 2473 | | | | | | | |
| Front_end_sheet_metal | 3197 | | | | | | | |

FIG. 4C.

SpreadSheet

Modify Penetration Parameters

| | |
|---|---|
| Thickness Factor | 1 |
| Thickness Adder | 0 |
| Fix Iterations | 10 |
| Fix Factor | 0.5 |

| Modify | Exit |

SYSTEM AND METHOD OF INTERACTIVELY ASSEMBLING A MODEL

CROSS REFERENCE TO RELATED APPLICATIONS

This application claims the benefit of U.S. provisional application Ser. No. 60/353,370, filed Feb. 1, 2002.

BACKGROUND OF INVENTION

1. Field of the Invention

The present invention relates generally to computer-assisted design of models and, more specifically, to a system and method of interactively assembling a geometric model for use in Computer-Aided Engineering analysis.

2. Description of the Related Art

Vehicle design, and in particular automotive vehicle design, has advanced to a state in which computer-assisted design techniques are frequently incorporated in the development of a new vehicle, or redesign of an existing vehicle. At the same time, enhanced visualization software tools have been developed that allow for interactive display and manipulation of large-scale geometric models, including models developed using Computer-Aided Design (CAD). The combined use of Computer-Aided Design and visualization techniques is especially beneficial in designing, packaging and assembling various proposals into a vehicle model, to evaluate the design and functional capabilities of the vehicle model. Advantageously, potential vehicle model designs can be considered in a timely and cost-effective manner by analyzing a digital representation of a proposed design, versus preparing a physical prototype of the vehicle.

One aspect of the design process is to construct a geometric model of the proposed design using a technique known as Computer-Aided Design (CAD). Another aspect of the design process is the use of mathematical tools, collectively referred to as Computer-Aided Engineering (CAE), to constrain and guide the designer in evaluating the design and to optimize the performance of the design. The use of a CAE simulation allows for verification of a design intent, and a prediction of a mechanical behavior of the design, including its systems, subsystems and components, and suggestion for improvement. CAE simulations are advantageous in particular types of vehicle analysis, such as vehicle analysis. Examples of CAE techniques include Finite Element Analysis (FEA) and Computational Fluid Dynamics (CFD). Various software tools are available to perform the CAE analysis. Recent enhancements to the software and the computing power of modern computers have resulted in a reduction in the amount of computer processing time required to perform the CAE analysis. Therefore, CAE tools can be utilized earlier in the design process and applied to a wider range of product development activities.

Vehicles, and in particular motor vehicles, are subject to regulations. Current practice relies on various methods to evaluate a proposed design. A physical "buck" or prototype may be utilized to provide information regarding the proposed design. A physical experiment may be performed using the physical prototype. It is time consuming to build the physical model, or to reconstruct the model after a test. An emerging trend in the vehicle design process, as a result of enhanced CAE computational capabilities, is the use of CAE analysis to predict how a particular vehicle design will respond when subjected to a predetermined test.

In particular, an initial evaluation of a design may be performed using a CAE simulation and a geometric mesh model. The engineer prepares the geometric mesh model for use in the CAE simulation corresponding to variations in a set of predetermined design parameters. As a result, tests may be conducted in earlier phases of the product development process, and proposed modifications to the design can be expeditiously analyzed. For example, a CAE analysis may provide the engineer with information regarding the integrity of the exterior shape of the vehicle, which is useful in the design of the exterior shape of a vehicle.

The validity of such a computer-assisted analysis is dependent on the quality of the geometric model. In turn, the quality of the model is dependent on various factors, including the skill and expertise of the modeler in assembling the model. Currently, the modeler manually integrates available software tools with engineering knowledge and best practice guidelines to assemble the geometric model. For example, the modeler may select a CAD model of component parts to be included in the assembled geometric model. The modeler may also select predetermined criteria relating to the model, as set forth in a best practice guideline available to the modeler. For a CAE analysis, a best practice guideline is utilized. The modeler may also select how to geometrically model a particular component. For example, a hinge may be modeled as a spring or a rigid body. Similarly, a spot weld may be modeled as a rigid element or a spring. These decisions influence the quality of the assembled model, and are dependent on the ability of the modeler.

While the current method works in assembling a model, there may be inconsistencies between models, which affect the overall integrity of the model. As a result, the information learned from a test using the assembled geometric model might not correlate well with the results of a test using a physical prototype. Also, there may be poor correlation between geometric models assembled by different modelers. Thus, there is a need in the art for a system and method of automatically assembling a geometric model for use in a Computer-Aided Engineering analysis that consistently generates a quality model, irrespective of the skill of the modeler.

SUMMARY OF INVENTION

Accordingly, the present invention is a system and method for interactively assembling a mesh model for use in engineering analysis. The system includes a user computer system having a memory, a processor, a user input device and a display device. The system also includes a remotely located computer system having a processor, a memory, and a data storage means in communication with the user computer system.

The method includes the steps of selecting a plurality of component parts having a best practice mesh model format and selecting a predetermined property for each of the selected component parts, wherein the predetermined property is selected from a best practice library stored on the data storage means. The method also includes the steps of determining if the mesh model for each of the selected component parts meets a predetermined mesh quality condition using a best practice mesh quality checking software program. The method further includes the steps of selecting a best practice connecting means for connecting the selected component parts, wherein the connecting means is selected from a best practice library of mesh models of connecting means stored in the data storage device, and assembling the selected component parts together using the connecting means and the best practice properties into a new mesh model using a best practice mesh assembly software program, and the assembled mesh model is available for further analysis.

One advantage of the present invention is that a system and method of interactively assembling a geometric model is provided that integrates available software tools with engineering knowledge and best practice guidelines. Another advantage of the present invention is that a system and method of interactively assembling a geometric model is provided that automates the model assembly process to improve efficiency and the quality of the model, for repeated evaluation of the preassembled model using CAE. Still another advantage of the present invention is that a system and method of interactively assembling a geometric model is provided with integral expert systems to assemble a model that is not dependent on the expertise of the user. A further advantage of the present invention is that a system and method of interactively assembling a geometric model is provided that automatically combines best engineering practices with best available modeling tools to consistently create a geometric model with improved mesh quality. Still a further advantage of the present invention is that a system and method of interactively assembling a geometric model is provided that is simpler to use and reduces the amount of time required to create the model. Yet a further advantage of the present invention is that a system and method of interactively assembling a geometric model is provided that assembles a quality model resulting in improved reliability of the CAE analysis results.

Other features and advantages of the present invention will be readily appreciated, as the same becomes better understood after reading the subsequent description taken in conjunction with the accompanying drawings.

DETAILED DESCRIPTION

A design of a model of a system is preferably achieved with a generic, parametric driven design process. Advantageously, the parametric process allows for flexibility in design and engineering analysis of the model in a fraction of the time required using conventional design methods. Various computer-based tools are integrated to achieve this enormous time and expense savings, including solid modeling, parametric design, and automated studies. In this example, the process is applied to a vehicle system, although other types of systems are foreseeable. The vehicle design is typically generated through the use of conventional computer-aided design (CAD), including computer-aided manufacturing (CAM) and computer-aided engineering (CAE) techniques.

Figure 1:
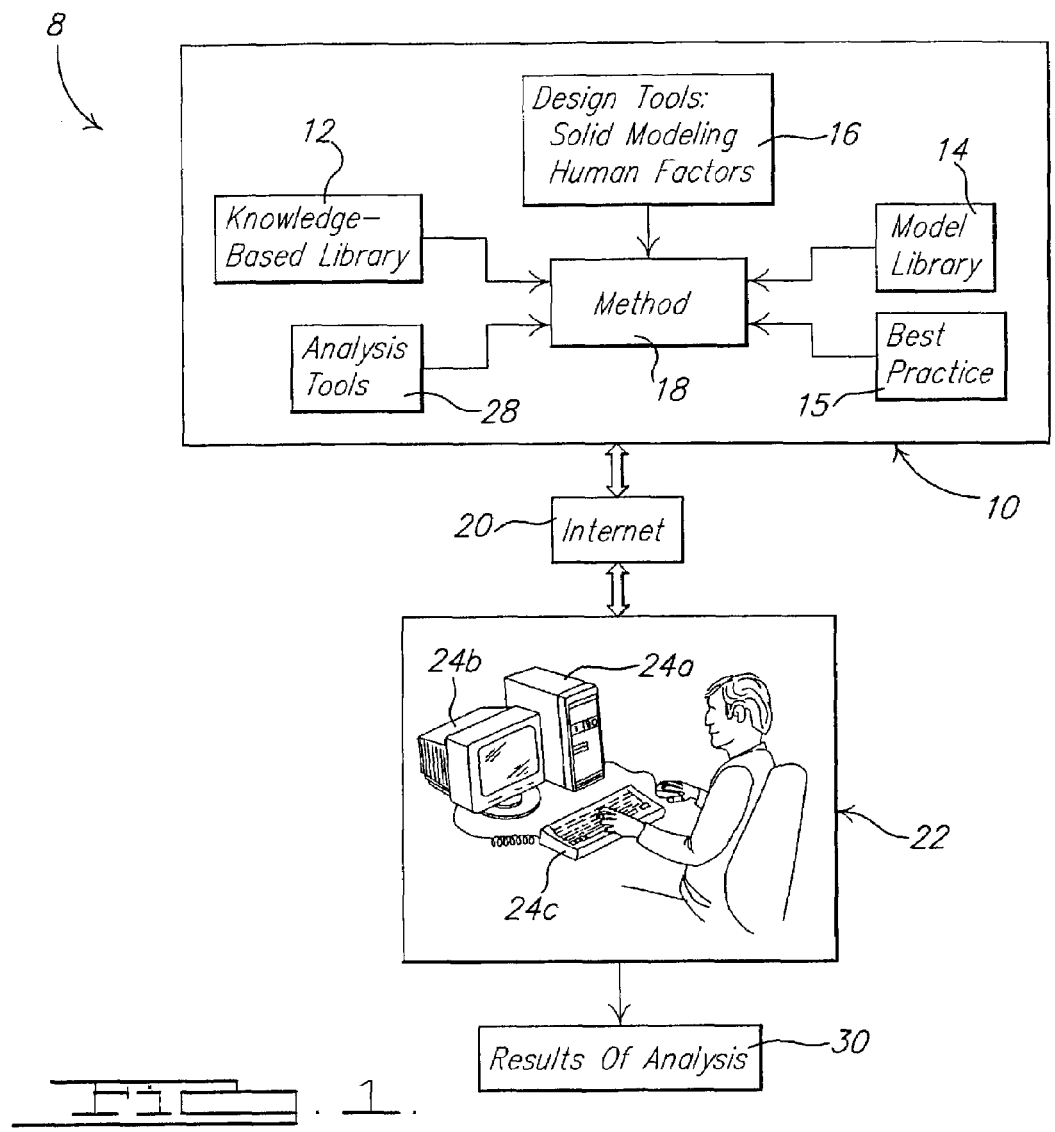
FIG. 1 is a diagrammatic view of a system for use in conjunction with a method of interactively assembling a geometric model for use in a CAE analysis, according to the present invention.

Referring to the drawings and in particular to FIG. 1, a system 8 for interactively assembling a mesh model is provided. The system 8 includes a remotely located computer system 10. The remotely located computer system 10 includes a server 18 having a processor, and a memory. The remotely located computer system 10 is in communication with a user computer system 22, to be described, using a communications network 20. The communications network 20 may include the Internet, an intranet, or the like used to transfer information.

The computer system 10 includes a knowledge-based engineering library 12, preferably stored on an electronic storage device in communication with the server 18. The knowledge-based engineering library 12 may include a database of sub-libraries containing an electronic representation of data including various experts' knowledge of information relevant to the design of a product, such as the vehicle. These sub-libraries may include information such as design, assembly, manufacturing, or rules and guidelines, or the like. In this particular example, a knowledge-based engineering library 15 may include guidelines establishing best practices. Various crash modes are frequently studied in a analysis, including front impact, side impact, rear impact and roof crush. The best practice may provide guidelines as to how to position the barrier, or the size of mesh to use in modeling a component for a particular crash mode.

The knowledge-based engineering library 12 may also contain data in electronic form regarding various types of vehicle subsystems, such as a component parts library of particular component parts used on a vehicle. For example, the library may include mesh modeling data for a component part, including minimum and maximum mesh size. Another example of a knowledge-based engineering library 12 is a library of weld data, including different weld techniques and guidelines on how to model a particular weld, such as a spot weld. The knowledge-based engineering library 12 may further contain predetermined product assumptions regarding the vehicle to be designed, such as model year, style, or production volume.

The computer system 10 also includes a model library 14, preferably stored on a remotely located electronic storage device. In this example, the model library 14 contains models, or an electrical representation of an exterior portion of a vehicle model or a portion thereof, such as individual component parts. The models may be stored in a CAD or mesh format or the like. It should be appreciated that the model library 14 may be a sub-library of the knowledge-based engineering library 12.

The computer system 10 may also include various Computer-Aided Design (CAD) tools 16 which may be used by the method, to be described. These design tools 16 may include solid modeling, surface modeling visualization and parametric design techniques. Solid modeling, for example, takes electronically stored vehicle model data from the model library 14 and standard component parts data from the knowledge-based engineering library 12 and builds complex geometry for part-to-part or full assembly analysis. Several modeling programs are commercially available and generally known to those skilled in the art. The parametric design technique is used in the electronic construction of geometry within the user computer system 22, for designing the vehicle or a portion thereof. As a particular dimension or parameter is modified, the computer system 22 is instructed to regenerate a new geometry.

The computer system 10 also includes various computer-aided engineering (CAE) analysis tools 28. One example of a CAE analysis tool 28 is a analysis program. The analysis program simulates a predetermined situation, such as the impact of the model into a barrier at a given speed, or the impact of an object into a portion of the vehicle, or the like. Several software programs are commercially available to perform these analyses and are generally known to those skilled in the art, such as LS-Dyna or Radioss.

Another type of CAE analysis tool is a preprocessor used to convert a CAD model into a geometric mesh model. Various commercially available software programs are utilized, such as EASICRASH, SOFY, MCRASH, Moedit, HYPERMESH or the like. The selection of the software tool is dependent on the capability of the particular software tool and the model being assembled. It should be appreciated that the selection of the software tool will affect the integrity of the assembled model, and it is foreseeable that different tools can generate different models.

The system 8 includes a user computer system 22, having a processor, and a memory shown at 24a to process information relevant to the method for interactively assembling a geometric mesh model for CAE analysis. The user computer system 22 includes a display device 24b, such as a display terminal, to display information to the user 26.

In this example, information is displayed on the display device 24b in a series of screens, also referred to as a browser. A user 26 inputs information into the user computer system 22 when prompted to do so. The information may represent different parameter alternatives. The set of parameters or the set of instructions may be specific to the method of interactively assembling the model, wherein other data and information non-specific to the method may already be stored in the memory of the computer system 22. Selection and control of the information within a screen can be achieved by the user 26, via a user interactive device 24c, such as a keyboard or a mouse.

An example of an input method is a drawing technique used to draw a box around a local region of the model using the user interactive device 22c, such as the mouse. It should be appreciated that the drawing process includes a click, drag and release of the mouse, as is understood in the art. Another type of input method is a graphical user interface that allows menu selection, parameter modification and performs other types of viewing operations. Still another example of an input method is a pop-up dialog box containing available information or instructions. Preferably, the user computer system 22 is configured to provide for fast display capability for rendering and viewing of large complex mesh models.

An executable best practice mesh assembly computer software program 22 utilizes the set of information or instructions from the user 26, information from the libraries 12,14, design tools 16, analysis tools 28, Best Practice Guidelines 15 and any other information to carry out a method, according to the present invention and discussed in detail subsequently, of interactively assembling mesh a model by integrating software tools with engineering knowledge and best practices. The executable best practice mesh assembly software program is implemented by the user 26, and may be resident on the user computer system 22 or the server 18.

Advantageously, this is a time and cost savings as compared to previous manual methods of assembling a model for CAE analysis or performing the same evaluation using a physical prototype. In addition, the computer-implemented method of interactively assembling a model combines all of the foregoing to provide an efficient, flexible, rapid tool for evaluating the various design proposals. Furthermore, the assembled mesh model 30 is available for further analysis and study, such as in a CAE analysis of this example.

Figure 2:
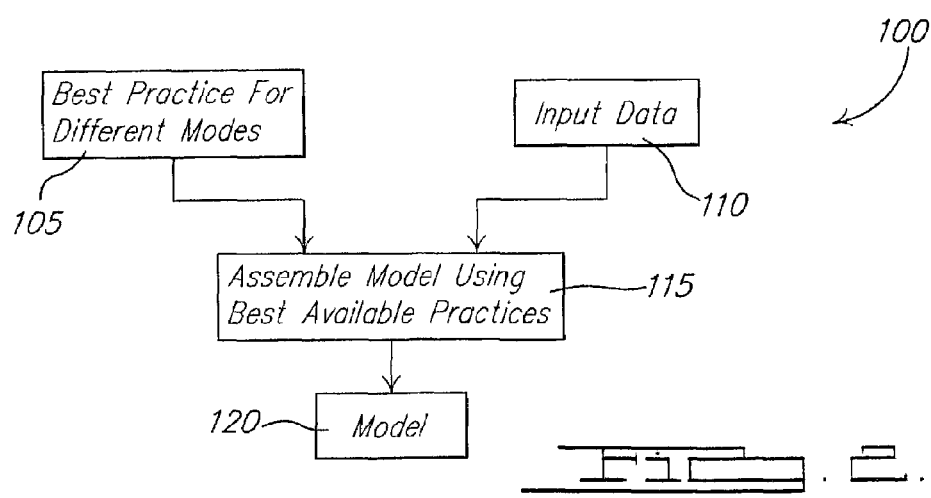
FIG. 2 is a diagrammatic view illustrating a method of interactively assembling a geometric model using the system of FIG. 1, according to the present invention.

Referring to FIG. 2, a diagrammatic overview of a process for assembling a model for use in CAE analysis is illustrated at 100. In this example, the assembled model is a vehicle model that is used for a CAE analysis. This process advantageously integrates available software tools with engineering knowledge and recognized best practices to assemble a geometric mesh model suitable for CAE analysis.

As shown in block 105, best engineering practice standards are available to provide guidance to a designer regarding a particular design. These standards include technical specifications and guidelines. The best engineering practice standards are maintained in a library, such as the knowledge-based best practice library 15 previously described. In this example, best practices are available which detail how to model each component part in the model as a geometric mesh model. The best practice is also dependent on the test mode, which in this example is an impact mode. Examples of impact modes include front impact, roof impact side impact or rear impact. Examples of best practices include criteria for positioning an impact barrier. Other best practices provide guidelines for relating to how a particular component is meshed, such as a rigid element or as a spring. Still other best practices relate to the geometric mesh, and may refer to minimum and maximum mesh size, mesh shape or warping.

In block 110, other model input data is made available to the user 26. For example, a CAD model or a mesh model of a component part may be available. Preferably, the model is maintained in the previously described model library 14. The model may be of a particular component or an entire vehicle. Other knowledge-based libraries 12 may be available to the user, such as a master weld knowledge-based library-containing information for connecting two component parts by welding or a connector library for connecting component parts together using a mechanical connector such as a hinge.

Figure 3:
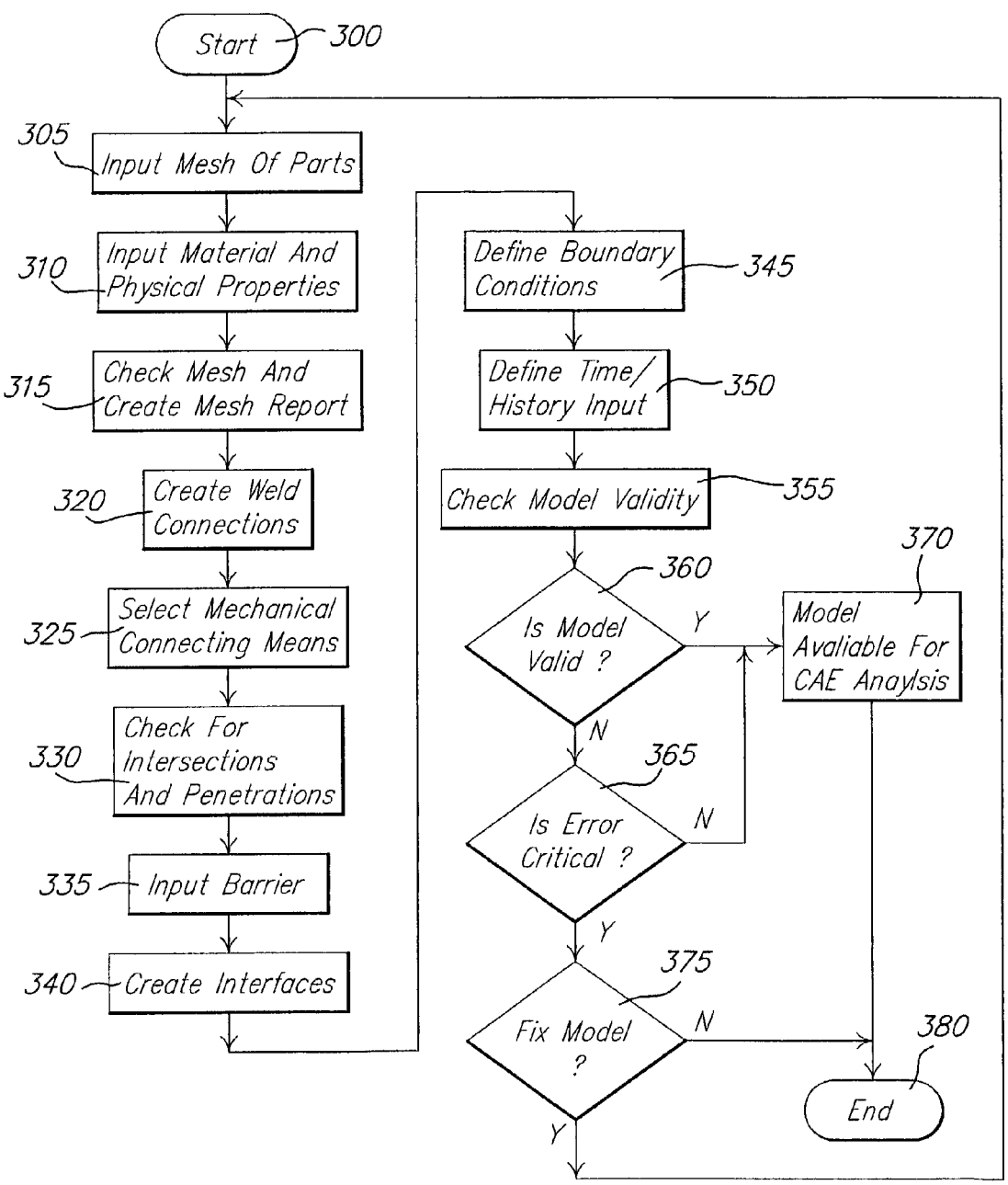
FIG. 3 is a flowchart of a method of interactively assembling a geometric model using the system of FIG. 1, according to the present invention.
Figure 4A:
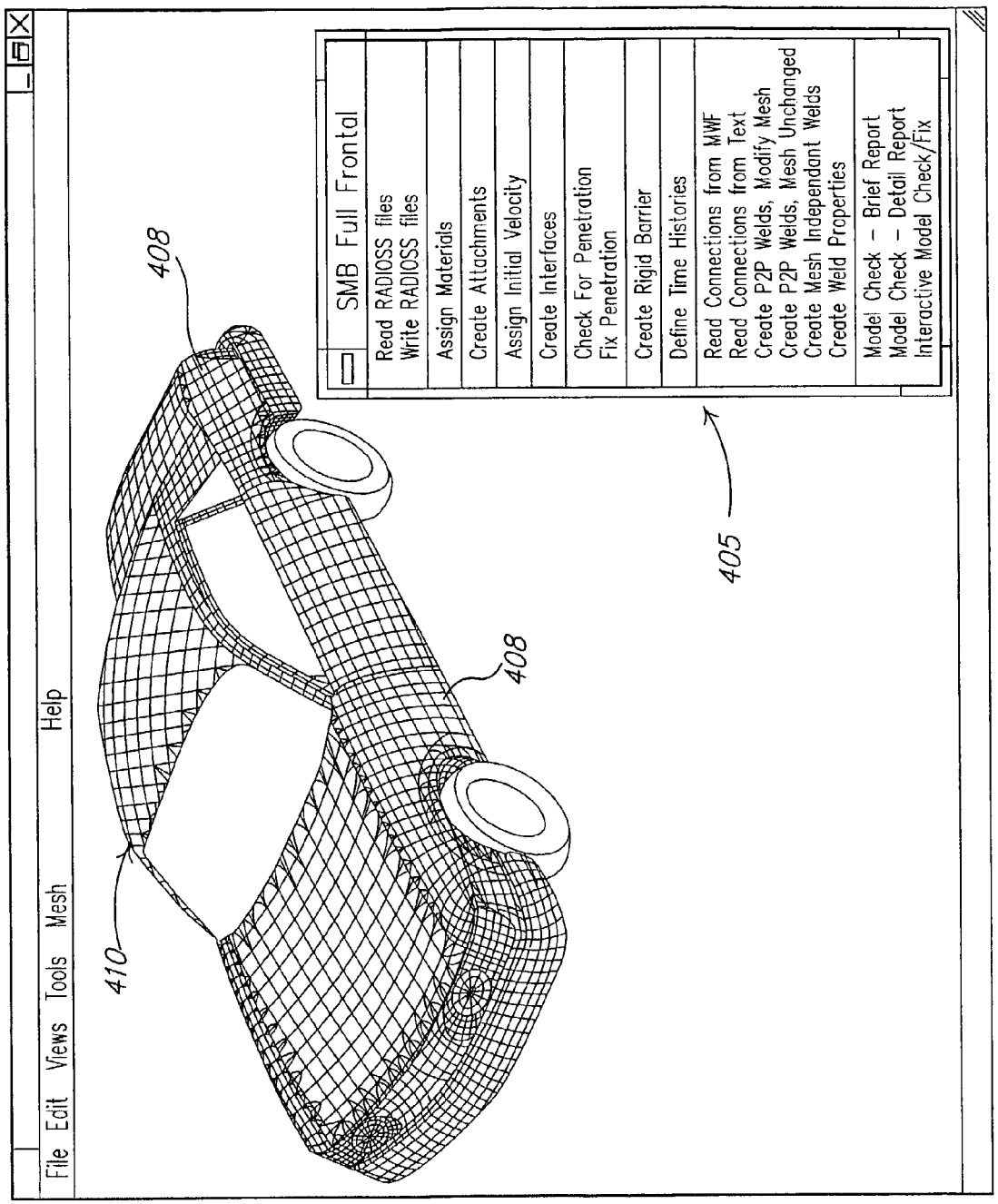
FIGS. 4A 4E are diagrammatic views of a series of computer screens illustrating the implementation of the method of FIG. 3 using the system of FIG. 1, according to the present invention.
Figure 4E:
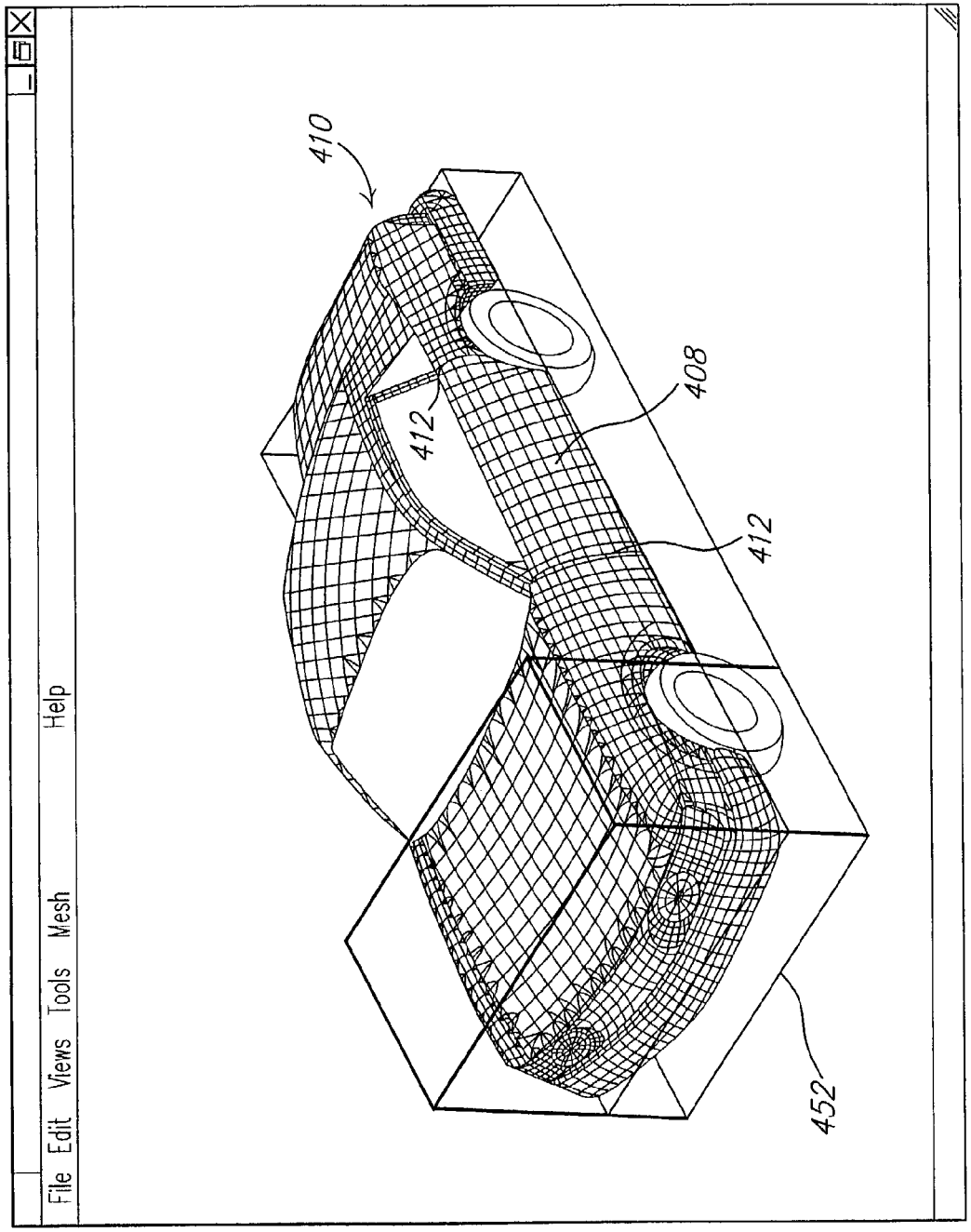

In block 115, the user uses the method to be described with respect to FIG. 3 to prepare a new mesh model for CAE analysis, as shown at block 120. The method is implemented by the best practice mesh assembly software program. The best practice mesh assembly software program integrates various commercially available software programs to assemble the component parts together using the selected connectors. In this example, the assembled mesh model is of a vehicle for a CAE analysis, as previously described. The best practice mesh assembly software program advantageously integrates engineering knowledge with known best practices and available CAD models to generate a new mesh model that is available for additional CAE analysis. This is a timesaving over current manual model assembly practices. It also ensures the quality and consistency of the assembled mesh model, which results in improved CAE analysis. The assembled mesh model is illustrated in FIGS. 4a and 4e.

Referring to FIG. 3, a flowchart of a method for assembling a new geometric mesh model is illustrated. The best practice software program for interactively assembling the geometric model may be resident on the remotely located computer system 10 and accessible by the user computer system 22, or resident on the user computer system 22. The best practice mesh assembly software program implementing the method advantageously integrates various software tools and expert knowledge to assembles a new mesh model for use in a CAE analysis, which in this example is a CAE analysis. An example illustrating implementation of the method (to be described) is shown in FIGS. 4A and 400. The mesh model is shown at 410. A window illustrating various menu options for implementing the method is shown at 405. The method takes advantage of the automated process to build a quality geometric mesh model irrespective of the modeling expertise of the user. In this example, the mesh model 410 is a geometric model for performing a CAE simulation to assess the properties of the model. Each point representing the model is uniquely identified by a set of coordinates within a known coordinate system. Known mesh formats include STL and NASTRAN.

For example, a topological structure of the mesh model can be created by organizing the mesh model into a list of polygons describing a surface of the boundary shape of a solid object into a connected surface mesh. Preferably, the surface is divided into a large number of polygons, to represent surface details with a certain degree of accuracy. The size of the polygons may not be fixed within all locations on the surface of the mesh model. Assumptions are made regarding the connectivity of the polygons. It is assumed that each polygon will have an inside area, and neighboring polygons along its edges and each vertex will have a set of connected polygons. It is also assumed that each polygon will have at most n neighboring polygons, each sharing an entire edge with the polygon, where n is the number of edges in the polygon. The mesh model further relies on knowing all the polygons connected to each vertex.

The methodology begins in block 300 and advances to block 305, where the user 26 selects a component part 408 for inclusion in the assembled mesh model. Mesh data for the component part 408 is imported into the executable computer software program for interactively assembling the mesh model. For example, the user 26 may select a component part 408 in a CAD format from a model library 14. The component part 408 is converted from a CAD file into a mesh file using commercially available software, such as IDEAS or ANSA or HYPERMESH or the like. The mesh model of the component part may also be stored in a database, such as the previously described knowledge-based engineering library 12. An advantage of storing component parts in a library is that different design programs for similar products can share a common library. This may result in a significant timesaving in preparing the mesh data. In this example, the user selects a plurality of component parts, and the component parts may be grouped and provided a group name for reference purposes. It should be appreciated that the software positions the component parts in predetermined locations for assembling the component parts together. The methodology advances to block 310.

In block 310, the user 26 selects characteristics regarding properties of each of the component parts 408 for use in assembling the mesh model 410. For example, the user 26 accesses the knowledge-based best practice library 15 to obtain information regarding suggested material and physical properties for the component part, such as material thickness. The user 26 is preferably provided a window on the display device 246 containing a component parts list. Using the user input device 246, the user 26 may highlight and select a part, change a material property for that part, or otherwise modify a material properties for the selected part. The material properties may be identified using a window displayed on the screen, as shown in FIG. 4B at 420. For example, a window may contain a "Set Material Property" option that is accessed by using the mouse 24c to "click" on the "Set Material Property" button as shown at 422. This option may provide a display including a list of components already associated with the model currently being worked on, and current material properties. Various other menu options may include "Select" to choose a component, "Standard Materials" to view a drop down menu of standard materials as shown at 424, "Save Changes" to save selections, or "Exit" to quit the menu, or the like. The methodology advances to block 315.

In block 315, the methodology checks the quality of each component part mesh, corrects the component part mesh if necessary and provides a mesh quality report to the user 26. It should be appreciated that the mesh quality report may be displayed as a screen on the display device 24b. In this example, the results of the mesh quality check are indicated in a matrix form and are accessible to the user, as shown in FIG. 4C at 430. The methodology automatically interfaces with best practice mesh quality checking software to check the mesh quality of each component part 408, fix the component mesh if necessary and create a mesh quality report. Various software programs are commercially available to perform this task, including VFLEX or SOFY. Various aspects of the mesh can be evaluated, including element number, element size, warpage, aspect ratio or interior angles. The methodology automatically selects the software that utilizes the best practices for checking mesh quality. A color-coding system is utilized in this example to visually indicate to the user 26 the status of the mesh quality for a component part. For example, problem areas may be indicated in red, caution areas in yellow, and acceptable mesh quality in green. The overall mesh quality may also be indicated in a message to the user 26, as shown at 432. The user 26 has the option of selecting a component part 408 and changing the component part mesh, to avoid irregularities in the finished model. The methodology advances to block 320.

In block 320, the user selects a connecting means 412 to connect predetermined component parts 408, such as by utilizing the master weld file to create a weld connection to connect the predetermined component parts. The master weld file is preferably an input from the knowledge-based engineering library 12, as previously described. The methodology iteratively creates welds, has access to a status report on the weld created or not created, displays free unconnected component parts, displays single, double, and triple thickness welds, and may import weld proprieties from a file. The methodology also determines the location of the weld points and defines the weld point in a coordinate frame, such as the xyz coordinate frame. After reviewing the weld connections, the user 26 may revise a weld connection as necessary. The methodology advances to block 325.

In block 325, the user 26 selects another connecting means 412 such as a mechanical connecting means for connecting component parts 408, and mesh data for the selected connection means is added to the assembled model. It should be appreciated that the user 26 may access connecting means data maintained in a knowledge-based library to geometrically model the connecting means. The methodology may summarize unconnected component parts to assist the user 26 in selecting a connecting means to connect the component parts. The user 12 selects a connection, and depending on the type of connection selected, the methodology may default to the best practice recommended method for created this type of connection.

Various types of connecting means 412 are contemplated in addition to a weld connection, such as a mechanical connector, hinge, latch, rivet, bolt or the like. The best practice may recommend a predetermined type of connecting means 412 depending on the use of the connecting means. For example, an engine mount or body mount may be modeled as a spring. A hinge may be modeled as a rigid body and a steering linkage joint may be modeled as a beam element.

The methodology utilizes the selected connecting means 412 to assemble the model. The methodology further integrates the software tools with information from the knowledge-based engineering library 12, best practices 15 and analysis tools 28 while assembling the model. It should be appreciated that at this point in the process, the component parts are assembled together into a unified model 410. The methodology advances to block 330.

In block 330, the methodology checks each of the component parts 408 in the assembled model 410 for intersections and penetrations, and corrects the component part mesh if an intersection or penetration is detected. An intersection or penetration is a physical penetration into the mesh. More specifically, an intersection crosses the barrier of the mesh, whereas a penetration crosses into the barrier of the mesh, but does not completely cross through it. Various software programs are commercially available for performing this task, and the methodology selects the best practice software program best suited for the task, such as MCCRASH, SOFY, EASICRASH or the RADIOSS method of checking initial penetration. The intersection and penetration results may be displayed in a window on the display 24b as shown in FIG. 4D at 440. The methodology advances to block 335.

In block 335, the user 26 defines a predetermined initial condition for the CAE analysis. It should be appreciated that the predetermined initial condition may be defined in government standards such as FMVSS208 or EURONCAP or the like. These initial conditions may include standard test and loading conditions, or test devices such as barriers or dummies, or monitoring locations. In this example, the predetermined initial condition is a barrier 452, and the user 26 defines the barrier and positions the barrier with respect to the assembled mesh model. It should be appreciated that the definition of the barrier 452 may be obtained from the knowledge-based engineering library 12. An analysis tool, such as RADIOSS, may be used to define the barrier 452. For example, the user 26 defines the shape of the barrier, such as a cylinder or a wall or the like. The methodology utilizes the best practice 15 to position the barrier 452 with respect to the assembled model 410, such as by defining the coordinates of the barrier 452 in a coordinate frame. The methodology advances to block 340.

In block 340, the user defines another predetermined initial condition for the CAE analysis, such as creating interfaces between components, and displays the interface to the user on the display screen. For example, the user 26 may select a group of elements to define a surface area of interest for that particular CAE analysis. Similarly, the user 26 may also look at a group of elements and define contact points using the best practice. Advantageously, the methodology assures that contact points are created in a consistent manner.

The methodology advances to block 345 and the user defines a further predetermined initial condition for the CAE analysis, such as boundary conditions for the specified impact mode. For example, the initial speed of the vehicle for a predetermined impact mode is specified using the best practice for that impact mode. The user may be provided the flexibility to modify a boundary condition.

The methodology advances to block 350 and the user defines yet a further predetermined initial condition for the CAE analysis, such as by defining time history entities. For example, the user may create a RADIOSS type time history selection, and the time history selection may be displayed on the display device 24b. The time history entities indicate points to monitor for post-processing purposes. The methodology advances to block 355.

In block 355, the methodology checks the quality of assembled mesh model 410 using a predetermined best practice software program for checking the quality of a model. For example, mesh connections between component parts are checked, and if a mesh connection does not meet a predetermined condition, the user is alerted. The user 26 may be provided a summary of mesh connections and their status.

The user 26 may also visually inspect the model to identify an unintended result. The methodology advances to diamond 360.

In diamond 360, the methodology utilizes the validity check of the model to determine if the mesh of the assembled model meets a predetermined mesh model validity criteria. For example, the methodology may utilize a commercially available software program, such as RADIOSS, to determine if the mesh of the assembled model is valid. If the mesh of the assembled model is not valid, the methodology advances to diamond 365. In diamond 365, the user determines if the error in the mesh of the assembled model will affect the use of the assembled model 410 in a predetermined CAE analysis. If determined that the error is not critical, the methodology advances to block 370, to be described. If determined that the error is critical, the methodology advances to diamond 375. In diamond 375 the user 26 selects whether to fix the mesh of the assembled model 410. If the user 26 selects to fix the mesh of the assembled model 410, the methodology returns to block 305 and continues. If the user 26 selects not to fix the mesh of the assembled model 410, the methodology advances to circle 380 and ends.

Returning to diamond 360, if the mesh of the assembled model is valid, the methodology advances to block 370. In block 370, the methodology makes the assembled mesh model available 410 for further analysis, which in this example is a CAE analysis. The assembled mesh model 410 with the predetermined initial condition is illustrated in FIG. 4E at 450. It should be appreciated that the assembled mesh model 450 may also be stored in a knowledge-based library 12, as previously described.

The above-described methodology is implement by a best practice mesh assembly software program that integrates several commercially available software tools into one environment to assemble the mesh model. The methodology interfaces between these software tools, to ensure that the tools are compatible, and applied in a consistent manner using best practice guidelines.

It should be appreciated that the above-described methodology is executable in an iterative manner, since the user 26 may elect to consider various sets of design parameters as part of a comprehensive study, or compare the results of the methodologies for modifying the feature. The methodology provides the assembled mesh model 410 in a user defined format.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

The invention of clamied is:

1. A method for interactively assembling a geometric mesh model that automatically complies with predetermined guidelines associated with a vehicular safety-related computer aided engineering analysis that predicts mechanical behaviors of the geometiic mesh model, using a computer system, said method comprising the steps of:

selecting a plurality of individual component parts by the user using the computer system, wherein each individual component part is a geometric mesh model that complies with corresponding predetermined guidelines associated with the vehicular safety-related computer aided engineering analysis of the mechanical behaviors of the assembled geometric mesh model, and is selected from a component parts library containing the geometric mesh model for each of the individual component parts, that is in communication with the computer system;

selecting a vehicular safety-related physical property for each of the selected individual component parts by a user, wherein the vehicular safety-related physical property is selected from a knowledge-based engineering library of vehicular safety-related physical properties, that is stored on a data storage means in communication with the computer system using, a corresponding predetermined rule for defining the physical property associated with the vehicle safety-related computer aided engineering analysis;

checking if the geometric mesh model for each of the selected individual component parts meets a predetermined geometric mesh model quality condition using a corresponding predetermined mesh model guideline associated with the vehicular safety-related computer-aided engineering analysis, by comparing a mesh model format for each of the selected individual component parts to the predetermined geometric mesh model quality condition and modifying the mesh model format for each of the selected individual component parts that do not meet the predetermined geometric mesh model quality condition;

selecting a connecting means for connecting adjoining individual component parts by a user, wherein the connecting means corresponding to each of the adjoining individual component parts is selected from a knowledge-based engineering library of predetermined geometric mesh models of connecting means for the vehicular safety-related computer aided engineering analysis of the mechanical behaviors of the assembled safety related geometric mesh model, that is stored in a data storage means in communication with the computer system, using a corresponding predetermined rule for defining the connecting means associated with the vehicular safety-related computer aided engineering analysis of the mechanical behavior of the assembled safety-related geometric mesh model; and assembling the checked geometric mesh model for each of the selected individual component parts, the selected connecting means geometric mesh model corresponding to each of the selected adjoining individual component parts and the selected vehicular safety-related physical property for each of the selected individual component parts into a safety-related geometric mesh model that automatically complies with the predetermined guidelines associated with the vehicular safety-related computer-aided engineering analysis and the assembled safety-related geometric mesh model is used by the vehicular safety-related computer aided engineering analysis to predict a mechanical behavior of the assembled safety-related geometric mesh model in a predetermined vehicle safety test computer simulation.

2. A method as set forth in claim 1 wherein said step of selecting a plurality of individual component parts further includes the step of selecting the geometric mesh model of each component part from a knowledge-based engineering library of geometric mesh component part models maintained in a data storage means in communication with the computer system.

3. A method as set forth in claim 1 wherein the connecting means is a weld connection and a geometric mesh model of the weld connection is maintained in a knowledge-based engineering weld connection library maintained in the data storage means in communication with the computer system and the weld connection is determined corresponding to a corresponding predetermined rule associated with the vehicle computer aided engineering analysis of the mechanical behavior of the assembled geometric mesh model in a vehicle impact computer simulation.

4. A method as set forth in claim 1 wherein the connecting means is a mechanical connector and a geometric mesh model of the mechanical connector is maintained in a knowledge-based engineering mechanical connector library maintained in the data storage means in communication with the computer system and the mechanical connector is determined using a corresponding predetennined rule associated with the vehicle computer aided engineering analysis of the mechanical behavior of the assembled geometric mesh model in a vehicle impact computer simulation.

5. A method as set forth in claim 1 wherein said step of checking if the component selected component part geometric mesh meets a predetermined mesh model quality condition includes the step of updating the selected component part geometric mesh model if determimined that the selected component part geometric mesh moded does not meet the predetermined mesh model quality condition.

6. A method as set forth in claim 1 further comprising the step of displaying the assembled safety-related geometric mesh model on a display device operatively in communication with the computer system.

7. A method as set forth in claim 1 further comprising the step of checking the assembled safety-related geometric mesh model for an intersection or a penetration using an executable geometric mesh model intersection or penetration checking software program that is in communication with the computer system.

8. A method as set forth in claim 1 further comprising the step of selecting a predetermined initial condition for the vehicular safety-related computer aided engineering analysis of the assembled safety-related geometric mesh model.

9. A method as set forth in claim 1 wherein the safety-related computer aided engineering analysis is a safety related vehicle impact computer aided engineering analysis thet predicts a mechanical behavior of the assembled safety-related geometric mesh model in a vehicle impact computer simulation.

10. A method as set forth in claim 1 furthe comprising the steps of:

determining if the assembled safety-related geometric mesh model meets a predetermined assembled model validity condition using a mesh model validity checking software program; and determining whether to revise the assembled safety-related geometric mesh model if the predetermined assembled model validity condition is not met and revising the assembled safety-related geometric mesh model if determined to revise the assembled safety-related geometric mesh model.

11. A method for interactively assembling a geometric mesh model that automatically complies with predetermined guidelines associated with a vehicle impact Computer-Aided Engineering (CAE) analysis that predicts a mechanical behavior of the geometric mesh model in a vehicle impact computer simulation using a computer system, said method comprising the steps of:

selecting a plurality of individual component parts by a user using the corresopnding predetermined guidelines associated with the vehicle impact CAE analysis, and having a geometric mesh model format from a component parts library containing geometric mesh models of the component parts and the component parts library is maintained in a data storage means operatively in communication with the computer system;

selecting a vehicular safety-related physical property for each of the selected individual component parts by the user, wherein the vehicular safety-related physical property is selected from a knowledge-based engineering library of vehicular safety-related physical properties, that is stored on a data storage means in communication with the computer system using a corresponding predetermined rule for defining the physical property associated with the vehicle impact computer simulation;

checking if the geometric mesh model for each of the selected individual component parts meets a predetermined geometric mesh quality condition using corresponding the predetermined mesh model guideline associated with the vehicle impact CAE analysis by comparing a geometric mesh model format for each of the selected individual component parts to the predetermined geometric mesh model quality condition and modifying the geometric mesh model for each of the selected individual component parts that do not meet the predetermined geometric mesh model quality condition;

selecting a connecting means having a geometric mesh model format for connecting adjoining individual component parts by the user, wherein the connecting means corresponding to each of the adjoining individual component parts is selected from a knowledge-based engineering library of predetermined geometric mesh models of connecting means for the vehicular safety-related computer aided engineering analysis of the mechanical behavior of the assembled safety-related geometric mesh model, that is stored in a data storage device in communication with the computer system, using a corresponding predetermined rule for defining the connecting means that is associated with the vehicle impact computer aided engineering analysis of the mechanical behavior of the assembled safety-related geometric mesh model in a vehicle impact computer simulation; and assembling the checked geometric mesh model for each of the selected individual component parts, the selected connecting means geometric mesh model corresponding to each of the selected adjoining individual component parts and the selected vehicular safety-related physical property for each of the selected component parts into a safety-related geometric mesh model of a vehicle that automatically complies with the perdetermined guidelines associated with the vehicle impact CAE analysis, and the assembled safety-related geometric mesh model of the vehicle is used by the vehicle impact computer aided engineering analysis to predict a mechanical behavior of the assembled safety-related geometric mesh model of the vehicle in a predetermined vehicle impact computer simulation.

12. A method as set forth in claim 11 wherein the connecting means is a weld connection and a geometric mesh model of the weld connection is maintained in a knowledge-based engineering weld connection library maintained in a data storage means in communication with the computer system and the weld connection is eetermined using a corresponding predetermined rule associated with the vehicle impact computer aided engineering analysis of the mechanical behavior of the assembled mesh model in a vehicle impact cobputer simulation.

13. A method as set forth in claim 11 wherein the connecting means is a mechanical connector and a geometric mesh model of the mechanical connector is maintained in a knowledge-based engineering mechanical connector library maintained in a data storage means in communication with the computer system and the mechanical connector is determined using a corresponding predetermined rule associated with the vehicle impact computer aided engineering analysis of the mechanical behavior of the assembled geometric mesh model in the vehicle impact computer simulation.

14. A method as set forth in claim 11 further comprising the step of checking the assembled safety-related geometric mesh model of the vehicle for an intersection or a penetration using an executable geometric mesh model intersection or penetration checking software program that is in communication with the computer system.

15. A method as set forth in claim 11 further comprising the step of selecting a predetermined initial condition for the vehicle impact Computer-Aided Engineering analysis of the assembled safety-related geometric mesh model.

16. A method as set forth in claim 11 further comprising the steps of:
determining if the assembled safety-related geometric mesh model of the vehicle meets a predetermined assembled model validity condition using a mesh model validity checking software program; and
determining whether to revise the assembled safety-related geometric mesh model of the vehicle if the predetermined assembled model validity condition is not met and revising the assembled safety-related geometric mesh model of the vehicle if determined to revise the assembled safety-related geometric mesh model of the vehicle.

* * * * *